US008339304B2

(12) United States Patent
Yokozawa

(10) Patent No.: US 8,339,304 B2
(45) Date of Patent: Dec. 25, 2012

(54) REMOTE CONTROL SIGNAL GENERATION DEVICE AND REMOTE CONTROL SYSTEM

(75) Inventor: Yukio Yokozawa, Shiojiri (JP)

(73) Assignee: Seiko Epson Corporation (JP)

( * ) Notice: Subject to any disclaimer, the term of this patent is extended or adjusted under 35 U.S.C. 154(b) by 1293 days.

(21) Appl. No.: 12/101,358

(22) Filed: Apr. 11, 2008

(65) Prior Publication Data

US 2008/0252509 A1 Oct. 16, 2008

(30) Foreign Application Priority Data

Apr. 13, 2007 (JP) ................................ 2007-105509
Feb. 26, 2008 (JP) ................................ 2008-044500

(51) Int. Cl.
*H04L 17/02* (2006.01)
*H01L 27/108* (2006.01)
*H01L 29/94* (2006.01)

(52) U.S. Cl. ........................................ 341/176; 257/299

(58) Field of Classification Search .......... 341/174–192; 348/14.05, 14.04, 734

See application file for complete search history.

(56) References Cited

U.S. PATENT DOCUMENTS 6,822,602 B2 * 11/2004 Kang et al. .................... 341/173
2002/0024617 A1 * 2/2002 Kwon .......................... 348/734
2005/0102699 A1 * 5/2005 Kim et al. ...................... 725/81
2005/0219424 A1 * 10/2005 Ryu ............................ 348/734

FOREIGN PATENT DOCUMENTS

| | | | |
|---|---|---|---|
| JP | 5-056484 | | 3/1993 |
| JP | 05-269372 | * | 3/1993 |
| JP | 2005-056484 | * | 9/2005 |
| JP | 2005-269372 | | 9/2005 |

* cited by examiner

*Primary Examiner* — Albert Wong
*Assistant Examiner* — Jerold Murphy
(74) *Attorney, Agent, or Firm* — Harness, Dickey & Pierce, P.L.C.

(57) ABSTRACT

A remote control signal generation device for converting a primary remote control signal compliant to one code system into a secondary remote control signal compliant to another code system, includes an exterior member having shape and size suitable for being held in a battery holder, instead of one of the plural number of batteries, a converter section, responsive to the exterior member being held in the battery holder to convert the supplied voltage into an output voltage corresponding to the rated electromotive force, a primary remote control signal detection section for detecting the primary remote control signal, a signal code conversion processing section for generating the secondary remote control signal compliant to the another code system corresponding to the primary remote control signal detected by the primary remote control signal detection section, and a secondary remote control signal transmission section for transmitting the secondary remote control signal.

13 Claims, 12 Drawing Sheets

| OPERATION | PRIMARY REMOTE CONTROL SIGNAL | SECONDARY REMOTE CONTROL SIGNAL |
|---|---|---|
| INCREASING SOUND VOLUME | 10010001 | 10101001 |
| DECREASING SOUND VOLUME | 10010010 | 10101010 |
| CHANNEL 1 | 10010100 | 10101100 |
| CHANNEL 2 | 10010101 | 10101101 |
| ⋮ | ⋮ | ⋮ |
| SWITCHING OF VIDEO MODES | 10011110 | 10111110 |
| ⋮ | ⋮ | ⋮ |

FIG. 5

| OPERATION | DETECTED OPERATION | SECONDARY REMOTE CONTROL SIGNAL |
|---|---|---|
| POWERING ON | SHAKING UPWARD | 10100000 |
| INCREASING SOUND VOLUME | DRAWING A CIRCLE CLOCKWISE | 10101001 |
| INCREMENTING CHANNEL | DRAWING A LINE FROM LEFT TO RIGHT | 10110010 |
| ⋮ | ⋮ | ⋮ |

FIG.11

REMOTE CONTROL SIGNAL GENERATION DEVICE AND REMOTE CONTROL SYSTEM

BACKGROUND

1. Technical Field

The present invention relates to a remote control signal generation device and a remote control system for converting a primary remote control signal compliant to one code system according to a predetermined remote controller into a secondary remote control signal compliant to another code system and outputting the secondary remote control signal.

2. Related Art

There has already been proposed a technology of receiving a remote control signal as a light signal from one remote controller (a transmitter), and converting the signal into a remote control signal for each of manufacturers and sequentially re-emitting light in accordance with the converted signal, thereby making it possible to operate two or more apparatuses of different manufacturers (see JP-A-5-56484, paragraphs 0001-0004, FIG. 1 (Document 1)).

According to the proposal in the Document 1, it is arranged to receive an infrared remote control signal by a light receiving section to convert it into an electrical signal, shape the waveform thereof after detection to input it to a CPU, make out an instruction in the remote control signal by the CPU, extract corresponding data from a memory section storing remote control signals for respective manufacturers as data, and emit the infrared remote control signal from a light emitting section based on the extracted data.

Further, on the other hand, there has been proposed a technology for automating an operation for designating a manufacturer in the conversion of the infrared remote control signal as described above (see JP-A-2005-269372, paragraphs 0003-0008, FIG. 1 (Document 2)).

According to the proposal in the Document 2, it is arranged to detect which remote control signal codes of two or more manufacturers prepared previously the electrical signal received by the light receiving section corresponds to, retrieve and then transmit the remote control signal related to a target device corresponding to the remote control signal code detected as corresponding thereto from a code storage section, and thus applying the remote control signal to remote control operations.

However, according to the technologies disclosed in the Document 1 or the Document 2, although convenience that a single remote controller can cope with two or more household electrical appliances can be obtained, the remote controller needs to be originally configured capable of coping with two or more target apparatuses and have a highly functional specification provided with a so-called multi-remote controller function.

Therefore, it would have to be said that such a remote controller has grossly excessive performance for an ordinary user who uses an ordinary remote controller with full satisfaction and does not particularly desire the multi-remote control function.

Therefore, it is conceivable that it does not conform with actual user needs in many cases to sell a single household electrical appliance such as a digital broadcasting receiver uniformly bundled with such a remote controller having a highly functional specification.

On the other hand, for the user who desires such a remote controller having the highly functional specification as described above, it is required to further obtain the remote controller with the highly functional specification provided with the so-called multi-remote control function in the condition of already possessing an ordinary remote controller bundled as accessory equipment with every household electrical appliance as a target apparatus, which causes wastefulness because the ordinary remote controller becomes useless after the remote controller with the highly functional specification has been obtained.

SUMMARY

An advantage of some aspects of the invention is to provide a remote control signal generation device and a remote control system using the remote control signal generation device which is configured to be able to be mounted in a battery holder of a common battery driven remote controller, and is capable of generating a valid remote control signal to an apparatus other than the target apparatus in the normal specification of the remote controller in the mounted condition.

The technologies listed below are proposed as aspects of the invention.

(1) A remote control signal generation device for converting a primary remote control signal compliant to one code system according to a predetermined remote controller into a secondary remote control signal compliant to another code system and outputting the secondary remote control signal, including an exterior member having shape and size suitable for being held in a battery holder, which is configured to hold a rated plural number of batteries having a predetermined specification to be applied as a power source for the remote controller to obtain a rated electromotive force by the rated number of batteries connected in series, instead of one of the plural number of batteries, a converter section, responsive to the exterior member being held in the battery holder instead of one of the batteries together with the others of the batteries, for being supplied with a voltage corresponding to a total value of the electromotive force of the others of the batteries to convert the supplied voltage into an output voltage corresponding to the rated electromotive force, a primary remote control signal detection section for detecting the primary remote control signal, a signal code conversion processing section for generating the secondary remote control signal compliant to the another code system corresponding to the primary remote control signal detected by the primary remote control signal detection section, and a secondary remote control signal transmission section for transmitting the secondary remote control signal generated by the signal code conversion processing section, and the converter section and the signal code conversion processing section are disposed in the exterior member.

According to the remote control signal generation section of (1), since an exterior member having shape and size suitable for being held in a battery holder in the battery driven remote controller, the remote control signal generation device provided with this exterior member can be mounted instead of one of the rated number (e.g., two) of batteries (hereinafter arbitrarily referred to as "actual batteries").

When thus mounted in the battery holder of the remote controller, the electromotive force (in the case in which two or more real batteries are provided, the electromotive force caused by the batteries connected in series) caused by the real battery mounted together therewith is stepped-up by the converter, and the rated voltage in the condition in which the rated number of real batteries are mounted can be obtained from the battery holder.

In other words, in the condition in which the remote control signal generation device according to the aspect of the invention is mounted instead of one real battery in the battery holder together with the real battery, the remote controller can be supplied with the power to each of the loads from the battery holder similarly to the case in which the real batteries are fully mounted therein, and thus can be operative.

The primary remote control signal emitted from the remote controller as usual is detected by the primary remote control signal detection section, and converted into the secondary remote control signal by the signal code conversion processing section, thus the secondary remote control signal is transmitted from the secondary remote control signal transmission section to the target apparatus.

According to the configuration described above, by mounting the remote control signal generation device according to the aspect of the invention in the battery holder of the battery driven remote controller, the primary remote control signal compliant to one code system related to the remote controller is converted into the secondary remote control signal compliant to another code system, and then the secondary remote control signal is output to be transmitted, thus it becomes possible to perform remote control of target apparatuses applying different code systems from each other with the same remote controller.

(2) The remote control signal generation device according to (1), wherein the primary remote control signal detection section is provided with a light receiving section for receiving an optical signal as the primary remote control signal of the remote controller.

According to the remote control signal generation device of (2) described above, specifically in the remote control signal generation device according to (1), in the case in which the primary remote control signal emitted by the remote controller as the remote control signal is an optical signal, the remote control signal is detected by the light receiving element of the primary remote control signal detection section, and the output signal thereof as the detection result can be provided to the process in the signal code conversion processing section in the next stage.

(3) The remote control signal generation device according to (1), wherein the primary remote signal detection section includes a load current detection section for detecting a load current corresponding to the primary remote control signal of the remote controller, and a primary remote control signal distinguishing section for distinguishing a content of the primary remote control signal based on a waveform of the load current detected by the load current detection section.

According to the remote control signal generation device of (3) described above, specifically in the remote control signal generation section according to (1), since the primary remote control signal detection section detects by the load current detection section the waveform of the load current flowing in conjunction with the operation for outputting the primary remote control signal when the remote controller operates to emit the primary remote control signal, and is provided with the primary remote control signal distinguishing section for distinguishing the content of the primary remote control signal based on the waveform of the current as the result of the detection, the output signal as the distinguishing result can be provided to the process in the signal code conversion processing section of the next stage.

(4) The remote control signal generation device according to (1), wherein the signal code conversion processing section includes a data holding section holding a data table from which correspondence between the one code system and the another code system is referable.

According to the remote control signal generation device of (4) described above, specifically in the remote control signal generation device according to (1), the signal code conversion processing section holds, in the data holding section, the data table to be looked-up for the correspondence between the one code system and the another code system, and converts the primary remote control signal compliant to the one code system into the secondary remote control signal compliant to the another code system with reference to the data table.

(5) The remote control signal generation device according to (4), further including a wireless communication section for obtaining the data table to be held in the data holding section by communication with the outside.

According to the remote control signal generation device of (5), specifically in the remote control signal generation device according to (1), the data table to be held in the data holding section can be obtained from the outside by the communication of the wireless communication section. It is possible to prepare the exact data table according to need.

(6) The remote control signal generation device according to (1), wherein the signal code conversion section includes a control signal analyzing section for analyzing a content of the primary remote control signal detected by the primary remote control signal detection section.

According to the remote control signal generation device of (6), specifically in the remote control signal generation device according to (1), since the signal code conversion processing section is provided with the control signal analyzing section for analyzing the content of the primary remote control signal detected by the primary remote control signal detection section, the output signal as the analyzing result is provided to the signal code conversion process.

(7) The remote control signal generation device according to (1), wherein the secondary remote control signal transmission section includes a light emitting element for transmitting the secondary remote control signal generated by the signal code conversion processing section with an optical signal.

According to the remote control signal generation device of (7), specifically in the remote control signal generation device according to (1), since the secondary remote control signal transmission section is provided with the light emitting element for transmitting the secondary remote control signal generated by the signal code conversion processing section on the optical signal, the target apparatus compatible to the optical signal from the light emitting element can be remote-controlled.

(8) The remote control signal generation device according to (1), further including a motion sensor signal conversion section for generating the secondary remote control signal based on a predetermined output of motion sensor.

According to the remote control signal generation device of (8), specifically in the remote control signal generation device according to (1), since there is further included the motion sensor signal conversion section for generating the secondary remote control signal based on the output of the motion sensor, in the operation mode in which the output signal from the motion sensor signal conversion section is used effectively, the remote control signal corresponding to the form of the motion (i.e., the motion of the remote controller having the remote control signal generation device mounted in the battery holder) of the remote control signal generation device is emitted, thus it becomes possible for the user to control the target apparatus by providing the remote controller with a motion such as shaking it so as to draw a specific moving locus.

(9) The remote control signal generation device according to (1), further including a position detection sensor, a time information obtaining section, and a movement history data generation processing section for generating movement history data of the exterior member based on outputs of the position detection sensor and the time information obtaining section.

According to the remote control signal generation device of (9), specifically in the remote control signal generation device according to (1), there are provided the position detection sensor and the time information obtaining section, and the movement history data generation processing section generates the movement history data of the exterior member (i.e., of the remote controller having the remote control signal generation device mounted in the battery holder) based on the outputs of the position detection sensor and the time information obtaining section. In, for example, the case in which the remote controller is used for a digital broadcasting receiver as the target apparatus, there can be provided a way to make the remote controller intelligent such that it can identify two or more users by, for example, learning the movement history data to perform a tuning operation suitable for the identified user by priority in accordance with the circumstance.

(10) The remote control signal generation device according to (9), further including an operation history data generation processing section for generating operation history data based on an operation condition of at least one of the primary remote control signal detection section and the signal code conversion section processing section and an output of at least one of the position detection sensor and the time information obtaining section.

According to the remote control signal generation device of (10), specifically in the remote control signal generation device according to (9), the operation history data generation processing section generates the operation history data regarding the remote control signal generation device (i.e., regarding the remote controller having the remote control signal generation device mounted in the battery holder) based on the operation condition of at least one of the primary remote control signal detection section and the signal code conversion section processing section and the output of at least one of the position detection sensor and the time information obtaining section.

Therefore, there is provided a way to provide the user of the remote controller with further convenience such that it can find out a tendency of the remote control by, for example, learning the operation history data to perform specific control by priority in accordance with the condition.

Further, by arranging that the operation history data is transmitted to the outside via, for example, wireless communication (a wireless LAN), it can serve an application usage such that the safety of the user is estimated from the use condition regarding the remote controller, thereby watching the user from a relatively distant place.

(11) The remote control signal generation device according to any one of (1) through (10), there is further included an ID storage section for storing a unique identification number.

According to the remote control signal generation device of (11), specifically in the remote control signal generation device according to any one of (1) through (10), there is further included the ID storage section for storing a unique identification number.

Therefore, the remote control signal generation device (i.e., the remote controller having the remote control signal generation device mounted in the battery holder) can be identified by the identification number, thus it becomes possible to make correspondence between the operation to the target apparatus and the identification number inside the remote control signal generation device or in the outside.

(12) The remote control signal generation device according to (11), wherein the ID storage section includes a storage medium storing the identification number, and a reading device for retrieving the identification number stored in the storage medium, and the storage medium is detachably attached to the reading device.

According to the remote control signal generation device of (12), specifically in the remote control signal generation device according to (11), the storage medium storing the identification number and reading device for retrieving the identification number stored in the storage medium are provided, and the storage medium is detachably attached to the reading device.

Therefore, the identification number of the remote control signal generation device (i.e., the remote controller having the remote control signal generation device mounted in the battery holder) can be replaced by replacing the storage medium, thus it becomes possible to, for example, make correspondence between the operations of two or more users and the identification numbers in a single remote control signal generation device by replacing it with the storage medium storing the identification number of a different user.

(13) A remote control system including a remote control signal generation device for converting a primary remote control signal compliant to one code system according to a predetermined remote controller into a secondary remote control signal compliant to another code system and outputting the secondary remote control signal, and a target apparatus controlled by the remote control signal generation device, wherein the remote control signal generation device includes an exterior member having shape and size suitable for being held in a battery holder, which is configured to hold a rated plural number of batteries having a predetermined specification to be applied as a power source for the remote controller to obtain a rated electromotive force by the rated number of batteries connected in series, instead of one of the plural number of batteries, a converter section, responsive to the exterior member being held in the battery holder instead of one of the batteries together with the others of the batteries, for being supplied with a voltage corresponding to a total value of the electromotive force of the others of the batteries to convert the supplied voltage into an output voltage corresponding to the rated electromotive force, a primary remote control signal detection section for detecting the primary remote control signal, a signal code conversion processing section for generating the secondary remote control signal compliant to the another code system corresponding to the primary remote control signal detected by the primary remote control signal detection section, a secondary remote control signal transmission section for transmitting the secondary remote control signal generated by the signal code conversion processing section, and an ID storage section for storing a unique identification number, the converter section and the signal code conversion processing section being disposed inside the exterior member, and the target apparatus includes an ID storage section for storing a unique identification number, the remote control signal generation device and the target apparatus communicating the identification numbers stored respectively in the remote control signal generation device and the target apparatus.

According to the remote control system of (13), since an exterior member having shape and size suitable for being held in a battery holder in the battery driven remote controller in the remote control signal generation device, the remote control signal generation device provided with this exterior member can be mounted instead of one of the rated number (e.g., two) of actual batteries.

When thus mounted in the battery holder of the remote controller, the electromotive force (in the case in which two or more real batteries are provided, the electromotive force caused by the batteries connected in series) caused by the real battery mounted together therewith is stepped-up by the converter, and the rated voltage in the condition in which the rated number of real batteries are mounted can be obtained from the battery holder.

In other words, in the condition in which the remote control signal generation device according to the aspect of the invention is mounted instead of one real battery in the battery holder together with the real battery, the remote controller can be supplied with the power to each of the loads from the battery holder similarly to the case in which the real batteries are fully mounted therein, and thus can be operative.

The primary remote control signal emitted from the remote controller as usual is detected by the primary remote control signal detection section, and converted into the secondary remote control signal by the signal code conversion processing section, thus the secondary remote control signal is transmitted from the secondary remote control signal transmission section to the target apparatus.

Further, the remote control signal generation device and the target apparatus are each provided with the ID storage section for storing the unique identification number.

Then, the remote control signal generation device and the target apparatus communicate the identification numbers stored respectively in the remote control signal generation device and the target apparatus.

According to the configuration described above, by mounting the remote control signal generation device according to the aspect of the invention in the battery holder of the battery driven remote controller, the primary remote control signal compliant to one code system related to the remote controller is converted into the secondary remote control signal compliant to another code system, and then the secondary remote control signal is output to be transmitted, thus it becomes possible to perform remote control of target apparatuses applying different code systems from each other with the same remote controller.

Further, it becomes also possible that the remote controller transmits the identification number to the target apparatus and the target apparatus performs control corresponding to the identification number.

BRIEF DESCRIPTION OF THE DRAWINGS

The invention will now be described with reference to the accompanying drawings, wherein like numbers reference like elements.

FIG. 5 is a diagram showing a specific example of a data table used for a conversion process for converting a primary remote control signal into a secondary remote control signal compliant to another code system.

FIG. 11 is a diagram showing a specific example of a command conversion table used for a conversion process for converting motion of a remote controller 100 detected by a motion sensor 281 into a secondary remote control signal.

DESCRIPTION OF EXEMPLARY EMBODIMENTS

Figures 1A, 1B, 1C:
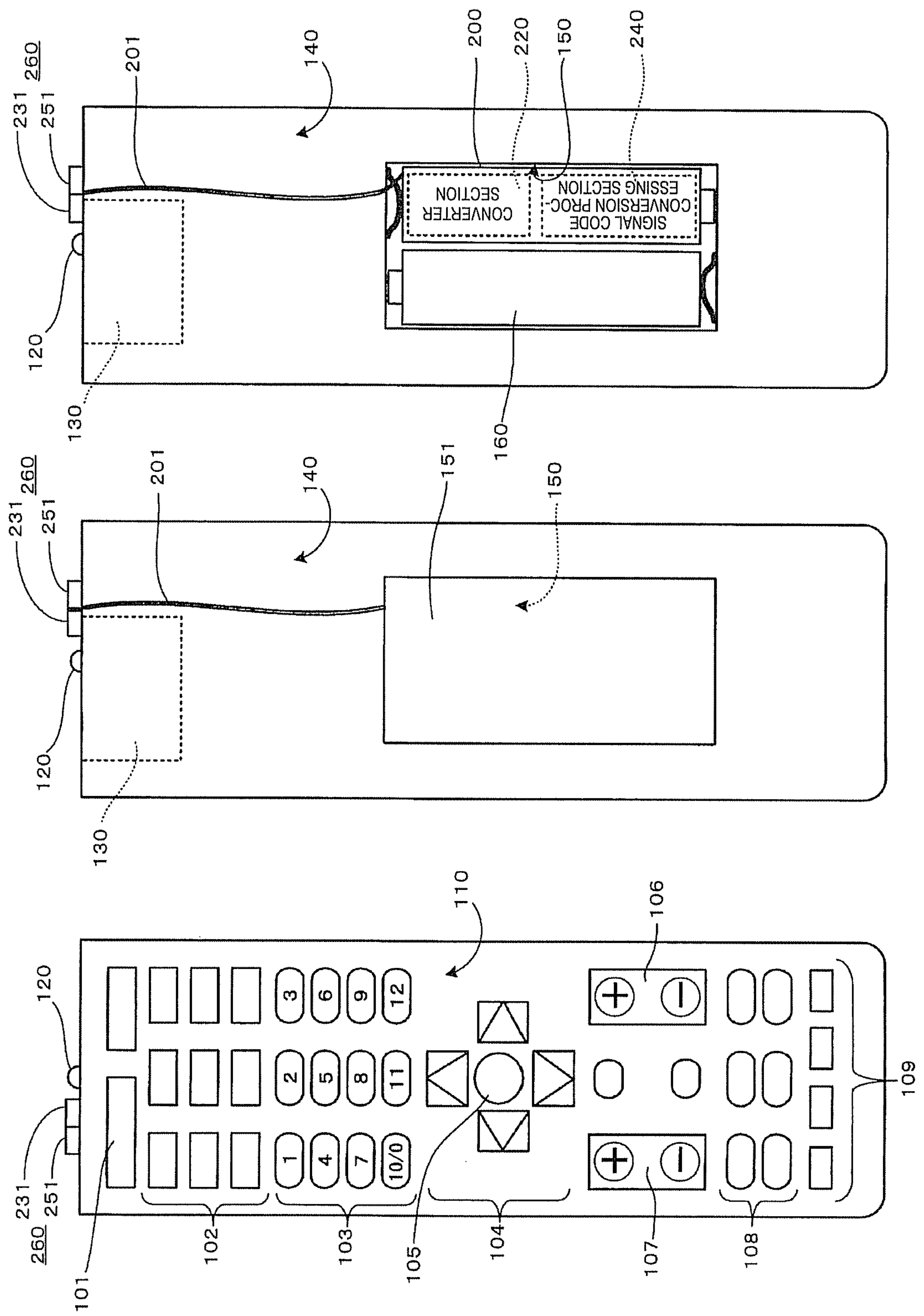
FIGS. 1A, 1B, and 1C are diagrams showing an example of a remote controller having a remote control signal generation device according to an embodiment of the invention mounted in a battery holder thereof.

Embodiments of the invention will hereinafter be explained with reference to the accompanying drawings. It should be noted that in the drawings the descriptions refers to below, substantial parts to be focused on in the explanations are arbitrarily exaggerated and other parts than the substantial parts are arbitrarily simplified or omitted for the sake of convenience.

FIGS. 1A, 1B, and 1C are diagrams showing a digital broadcasting receiver remote controller (hereinafter arbitrarily referred to as "a remote controller") as an example of a remote controller having a remote control signal generation device according to an embodiment of the invention mounted in a battery holder thereof.

FIG. 1A is a plan view of the remote controller, FIG. 1B is a bottom view (with a battery lid closed) of the remote controller, and FIG. 1C is a bottom view (without the battery lid) of the remote controller.

Although on an operation panel 110 of the remote controller 100, there are disposed, for example, a power button 101, an input and function switching button group 102, a direct tuning button group 103, a vertical and horizontal move button group 104, a decision button 105, a channel increment and decrement button 106, a volume control button 107, a viewing mode selection button group 108, and a color button group 109, the compatibility of applying the remote control signal generation device according to the embodiment of the invention is not particularly limited by the number, the layout, or the functions of the operation buttons of the remote controller.

On the front end section of the remote controller 100, there is disposed a light emitting element 120 for transmitting a remote control signal of an infrared beam.

On the inner front end side of the remote controller 100, there is disposed a control circuit 130 for generating the remote control signal (the remote control signal compliant to one code system according to the remote controller 100, arbitrarily referred to as "a primary remote control signal" for explaining the concept of the invention) emitted from the remote controller 100 in accordance with an operation to the various kinds of buttons shown in FIG. 1A as illustrated with the broken lines in the bottom views shown in FIGS. 1B and 1C.

The control circuit 130 is configured including, for example, a light emitting element drive circuit for driving a light emitting element 120 in addition to a primary remote control signal generation functional section for generating the primary remote control signal as described above.

It should be noted that the primary remote control signal emitted from the remote controller 100 is formed of a format including a model name, a manufacturer appellation, and a code representing a content of the control. The secondary remote control signal described later has the same format.

A battery holder 150 disposed at substantially the center of a bottom face 140 of the remote controller 100 has an opening section closed with a battery lid 151 in a normal in-use condition of the remote controller 100.

However, in the condition in which the remote control signal generation device according to the embodiment of the invention is used while being mounted in the battery holder 150 of the remote controller 100, as shown in FIG. 1B, in the condition in which the opening section of the battery holder 150 closed with the battery lid 151, an extra fine conducting wire 201, which connects a housing 210 of a remote control signal generation device 200 mounted in the battery holder 150 and a reception/transmission unit 260 composed of a light receiving element 231 and light emitting element 251, is led out while being pinched by an edge of the opening section and the battery lid 151, and extends to the front end section of the remote controller 100 along the bottom face 140 thereof so as to reach the reception/transmission unit 260 attached to the front end section of the remote controller 100.

The battery holder 150 of the remote controller 100 has a specification of holding two batteries in parallel and supplying circuits of various sections inside the remote controller 100 as a load with electromotive force caused by the two batteries connected in series.

As shown in FIG. 1C, the remote control signal generation device 200 according to the embodiment of the invention is mounted in the battery holder 150 instead of one battery out of two batteries, which is the rated number of batteries, and steps up the electromotive force of the one battery (real battery) 160, which is disposed in the battery holder in parallel to the remote control signal generation device 200 so as to be artificially connected in series with the remote control signal generation device 200, with a converter section 220 to supply, from the battery holder 150, the load described above with the rated electromotive force in the case of mounting two actual batteries as the rated number of batteries.

In addition to the converter section 220, a signal code conversion processing section 240 described later is disposed inside the remote control signal generation device 200.

Figure 2:
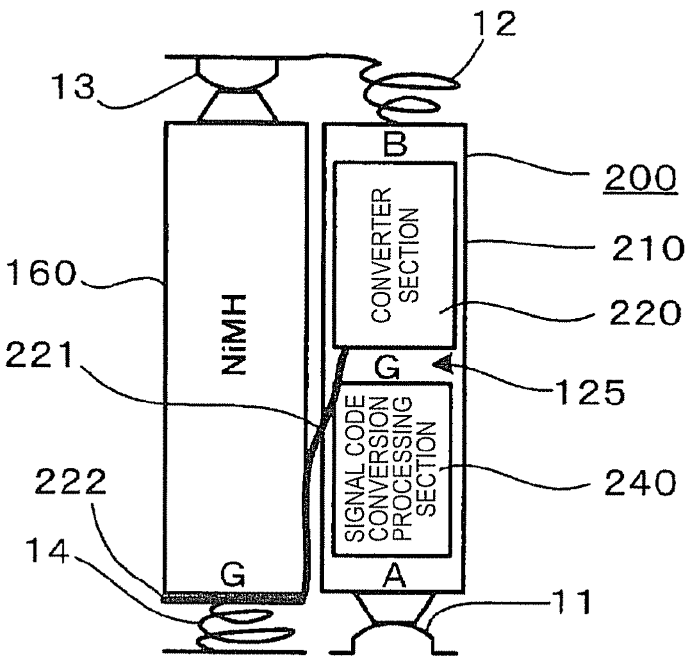
FIG. 2 is a diagram showing a relationship of electrical connection in the case of mounting the remote control signal generation device according to the embodiment of the invention in the battery holder of the remote controller shown in FIGS. 1A, 1B, and 1C.

FIG. 2 is a diagram showing a relationship of electrical connection in the case in which the remote control signal generation device 200 according to the embodiment of the invention is mounted in the battery holder 150 having a specification of mounting two batteries in parallel to each other in the remote controller 100 shown in FIGS. 1A through 1C.

It should be noted that since attention is focused on an explanation of the operation of the converter section 220 inside the remote control signal generation section 200 in FIG. 2, the reception/transmission unit 260 in FIGS. 1A to 1C and the covered conducting wire 201 as a wiring to the reception/transmission unit 260 are omitted from the illustration.

In FIG. 2, the battery holder is the same as those known to the public, and therefore, the structure section thereof is omitted from the illustration, and only the terminals are illustrated. The battery holder is a type of using the batteries connected in series as usual, and is provided with a first terminal 11 for forming an output terminal of the positive terminal side, a second terminal 12 of the negative terminal side and a third terminal 13 connected to each other for connecting the negative terminal of one of the two batteries and the positive terminal of the other of the two batteries, and a fourth terminal 14 for forming an output terminal of the negative terminal side.

In the present example, a normal nickel-metal-hydride rechargeable battery (described as "NiMH") 160 is mounted between the third terminal 13 and the fourth terminal 14, and the remote control signal generation device 200 as the embodiment of the invention is mounted between the first terminal 11 and the second terminal 12.

The converter section 220 supplied with a voltage corresponding to the electromotive force (in the case in which the battery holder applying two or more batteries is used, the total value of the electromotive force of those batteries) and converting the supplied voltage into an output voltage corresponding to the rated electromotive force is disposed inside the exterior member 210 of the remote control signal generation device 200.

Further, as shown in the drawing, the converter section 220 is mounted so as to occupy a part of amounting space 211 inside the exterior member 210, and further, the signal code conversion processing section 240 is disposed so as to be mounted in the rest of the mounting space 211.

It should be noted that in FIG. 2 and in FIG. 3 referred to below, descriptions of "A," "B," and "G" are provided for the sake of convenience in making it easy to contrast the input and output terminals with the equivalent circuit.

Figure 3:
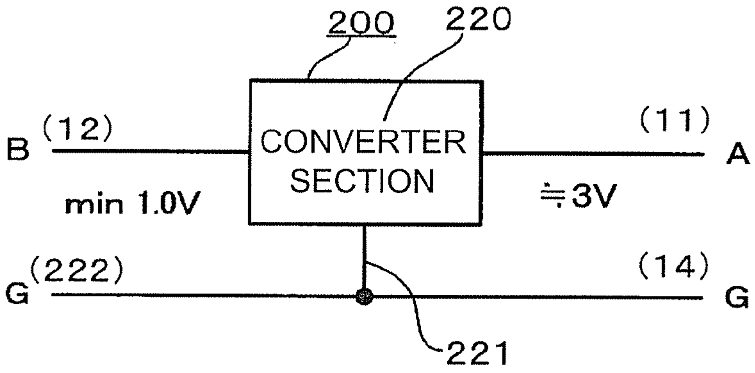
FIG. 3 is a diagram of an equivalent circuit showing voltages on the primary side and secondary side of a converter section of the remote control signal generation device shown in FIG. 2.

FIG. 3 is a diagram of an equivalent circuit showing voltages on the primary side and secondary side of the converter section 220 of the remote control signal generation device 200 shown in FIG. 2. As is understood from FIGS. 2 and 3, assuming the output terminal (positive terminal) of the remote control signal generation device 200 (the converter section 220 inside thereof) is A, and the negative terminal thereof is B, the negative terminal B has the same electrical potential as the positive terminal of the nickel-metal-hydride rechargeable battery 160.

Regarding the operating power source of the converter section 220 inside the remote control signal generation device 200, the positive terminal of the nickel-metal-hydride rechargeable battery 160 has contact with the positive input of the converter section 220 (i.e., the negative terminal B of the remote control signal generation device 200) to apply the electromotive force of the nickel-metal-hydride rechargeable battery 160, and the negative input of the converter section 220 is connected to the negative terminal of the nickel-metal-hydride rechargeable battery 160 (i.e., the fourth terminal 14 of the battery holder in FIG. 2) via a power supply wire 221.

In the present example, the power supply wire 221 is surely connected to the negative terminal of the nickel-metal-hydride battery 160 by a contacting conductor section 222 provided to an end section of the power supply wire 221 led out from the exterior member 210 of the remote control signal generation device 200 for obtaining electrical contact with a predetermined terminal of the battery holder.

With the operating power source connected thereto as described above, the converter section 220 is configured to generate the output voltage of about 3.0V, which is the rated electromotive force caused when the same type of two nickel-metal-hydride rechargeable batteries are used in series, even when a voltage of 1.0V, which is a substantial cut-off voltage of the nickel-metal-hydride rechargeable battery 160 as a lower limit value of the input voltage, is supplied thereto.

To sum up the operation described above with reference to FIGS. 2 and 3 extremely briefly, when the remote control signal generation device 200, which can be mounted in the battery holder similarly to the regular real battery, is mounted in the battery holder instead of one of the regular batteries, the converter section 220 inside the remote control signal generation device 200 steps up the electromotive force obtained from the other of the regular batteries (the nickel-metal-hydride rechargeable battery 160 in the above example), and as a result, the rated voltage corresponding to the case in which all the regular batteries are mounted therein is maintained on and output from the both terminals of the battery holders.

In the case in which the remote control signal generation device according to the embodiment of the invention described hereinabove is used while being mounted in the battery holder in combination with the nickel-metal-hydride rechargeable battery as the real battery, the various advantages as described below can be obtained.

Specifically, it becomes possible to apply a nickel-metal-hydride battery to an electronic apparatus having a specification of operating with an existing alkaline manganese battery. In this case, the concern of liquid leakage can be eliminated, and further, the battery can be used repeatedly by recharging, which becomes to be recommended from the viewpoint of nature conservation.

Further, the capacity of the high-capacity (low voltage) nickel-metal-hydride battery can fully be utilized. In other words, although only two thirds of the capacity of the advanced high-capacity nickel-metal-hydride battery can be used if the cut-off voltage is set to 1.2V as in the case of using the existing alkaline manganese battery, according to the converter inside the remote control signal generation device of the embodiment of the invention as described above, the nickel-metal-hydride battery can be used in a substantially equivalent manner to the case with the specification of 1.0V cut-off voltage, which is the cut-off voltage of the advanced high-capacity nickel-metal-hydride battery, thus the capacity thereof can fully be used.

In particular, since a recent improvement in performance of the nickel-metal-hydride battery is extremely rapid, and the battery capacity has advanced from 1600 mAH to 2700 mAH (cf about 800 mAH in the alkaline manganese battery) in about five years, the electronic apparatus (the remote controller) with a specification of using two alkaline manganese batteries in series can be used for a longer period of time without recharging (replacing) the battery when using one nickel-metal-hydride battery and the battery adapter according to the embodiment of the invention in combination.

Figure 4:
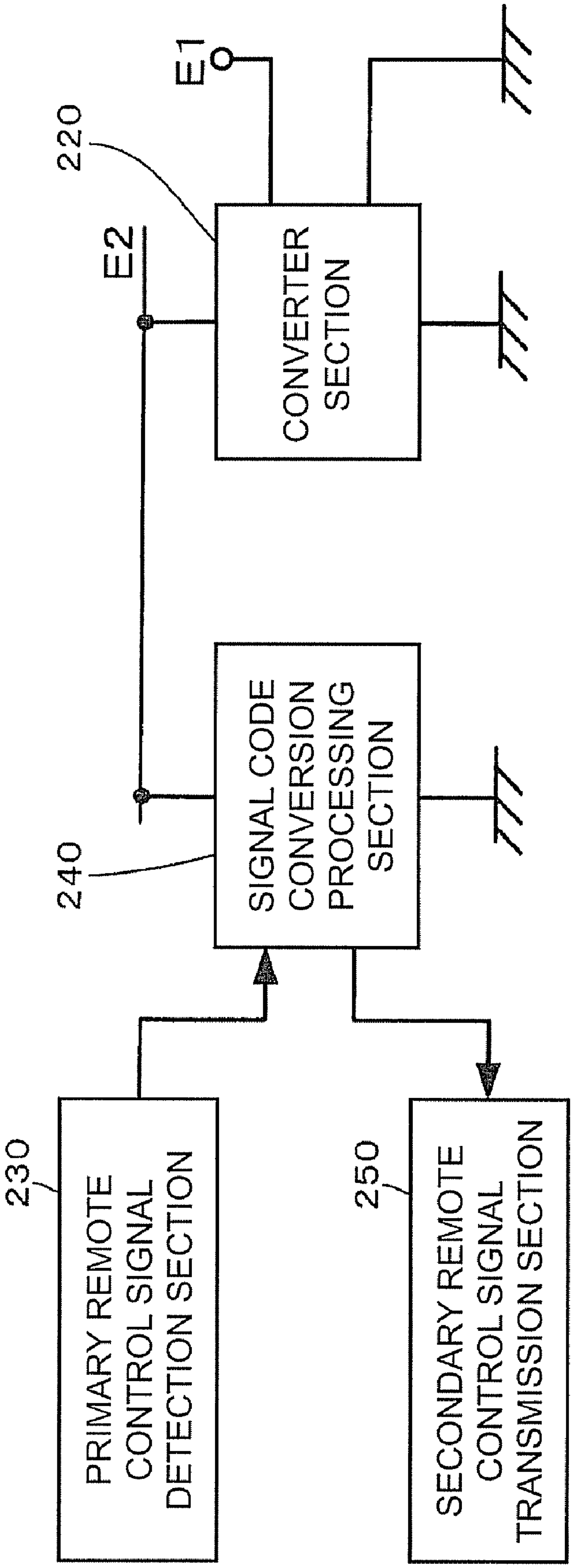
FIG. 4 is a block diagram showing a relationship among elements of the remote control signal generation device shown in FIG. 1C.

FIG. 4 is a block diagram showing the elements inside the exterior member 210 of the remote control signal generation device 200 explained with reference to FIGS. 1A, 1B, and 1C, and the elements outside the exterior member 210 connected thereto with the covered wire 201.

When the remote control signal generation device 200 according to the present embodiment of the invention is mounted in the battery holder 150 of the remote controller 100 in a manner described above, the electromotive force (in the case in which two or more real batteries are provided, the electromotive force caused by the batteries connected in series) E1 of the real battery mounted in the battery holder 150 together therewith is stepped up by the converter section 220, thus the rated voltage E2 in the condition in which the rated number of real batteries are mounted can be obtained from the battery holder 150.

In other words, in the condition in which the remote control signal generation device 200 according to the present embodiment of the invention is mounted in a similar manner to one real battery in the battery holder 150 together with the real battery, the remote controller 100 can be supplied with the power (the voltage E2) to each of the loads from the battery holder similarly to the case in which the real batteries are fully mounted therein, and thus can be operative.

The primary remote control signal emitted as usual from the above described light emitting element 120 of the remote controller 100 is detected by the primary remote control signal detection section 230 having the light receiving element 231, and converted by the signal code conversion processing section 240 into the secondary remote control signal which is then transmitted to a target apparatus from a secondary remote control signal transmission section 250 having a light emitting element 251.

Specifically, in FIG. 4, the signal code conversion processing section 240 is provided with a data table used for a conversion process for converting the primary remote control signal described above into the secondary remote control signal compliant to another code system.

When the primary remote control signal emitted as usual from the light emitting element 120 is detected by the primary remote control signal detection section 230 having the light receiving element 231, the signal code conversion processing section 240 generates the secondary remote control signal, which corresponds to the primary remote control signal thus detected, with reference to the data table. The secondary remote control signal thus generated by the signal code conversion processing section 240 is transmitted to the target apparatus from the secondary remote control signal transmission section 250.

FIG. 5 is a diagram showing a specific example of the data table used for the conversion process for converting the primary remote control signal into the secondary remote control signal compliant to another code system.

In FIG. 5, the data table stores signal codes of the primary remote control signal and signal codes of the secondary remote control signal corresponding thereto in a condition of one-to-one correspondence.

Further, the signal codes of the first remote control signal in the data table shown in FIG. 5 are made correspond to respective operational functions (e.g., increase or decrease in sound volume, holding down of each of the channel buttons, switching to the video mode) of the target apparatus provided to the remote controller 100.

It should be noted that regarding the functions (e.g., display of a program timetable in the digital broadcasting) other than the operational functions of the target apparatus provided to the remote controller 100, it is possible to realize the operational functions by converting the primary remote control signal into the secondary remote control signal in response to sequentially holding down two or more of the buttons provided to the remote controller 100 or holding down the buttons together.

In this case, the data table used for converting the primary remote control signal into the secondary remote control signal can be customized to the content corresponding to the target apparatus thus installed in accordance with the selection input of the user.

In other words, the content to be controlled by the secondary remote control signal can be set in accordance with the target apparatus thus installed by the user, and on this occasion, it is possible to set to a target source out of two or more sources (e.g., analog broadcasting, digital broadcasting, charged contents, or free contents).

Further, the data table can be configured so as to be changed in accordance with a location (i.e., difference in target apparatus thus installed) and time.

It should be noted that the secondary remote control signal transmitted from the secondary remote control signal transmission section 250 to the target apparatus in the present embodiment of the invention can be transmitted on an infrared beam or as a wireless signal of, for example, short-range wireless communication, and various kinds of communication media can be adopted thereto providing they can control the target apparatus.

According to the configuration described above, by mounting the remote control signal generation device 200 according to the present embodiment of the invention in the battery holder 150 of the battery driven remote controller 100, the primary remote control signal compliant to one code system related to the remote controller is converted into the secondary remote control signal compliant to another code system, and then the secondary remote control signal is output to be transmitted, thus it becomes possible to perform remote control of target apparatuses applying different code systems from each other with the same remote controller.

Figure 6:
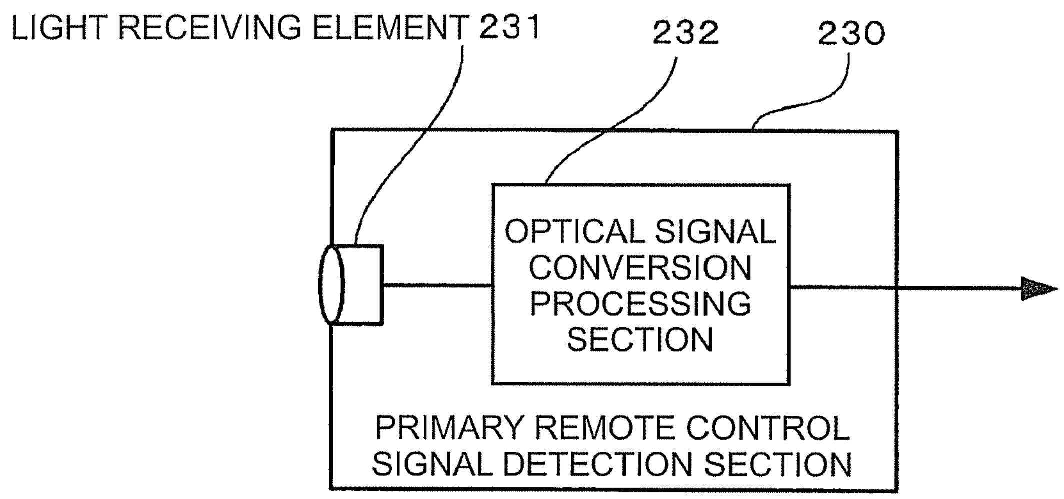
FIG. 6 is a diagram showing a configuration example of a primary remote control signal detection section in the remote control signal generation device shown in FIG. 4.

FIG. 6 is a diagram showing a configuration example of the primary remote control signal detection section 230 in the remote control signal generation device 200 shown in FIG. 4. The primary remote control signal detection section 230 is configured including the light receiving element 231 suitable for receiving the light emitted from the light emitting element for projecting the remote control signal light of the remote controller 100 and a light signal conversion processing section 232 for detecting the light received by the light receiving element 231 and converting or amplifying it into a signal suitable for supplying to the signal code conversion processing section 240 in the following stage.

When the remote controller 100 shown in FIGS. 1A through 1C is used as usual by the user operating the buttons thereof, the remote control signal on, for example, an infrared beam is projected from the light emitting element 120, and the projected light is received by the light receiving element 231 disposed adjacently to the light emitting element 120 in the example shown in FIGS. 1A through 1C, and is converted into an appropriate signal by the light signal conversion processing section 232 to be supplied to the primary remote control signal detection section 230.

Therefore, in the primary remote control signal detection section 230, the primary remote control signal of the remote controller 100 emitted in response to the button operation is converted into the secondary remote control signal different in code system from the primary remote control signal by the action of the signal code conversion processing section 240, and the secondary remote control signal is output therefrom.

Figure 7:
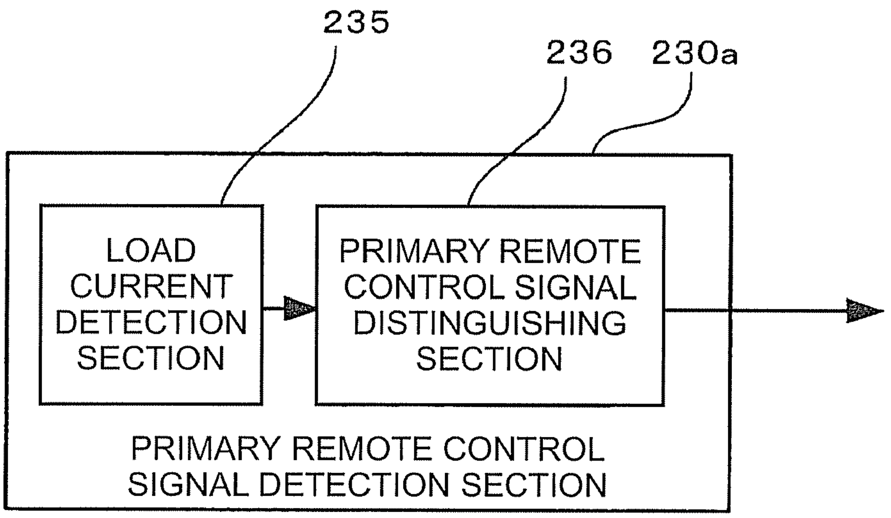
FIG. 7 is a diagram showing another example of the primary remote control signal detection section in the remote control signal generation device shown in FIG. 4.

FIG. 7 is a diagram showing another example of the primary remote control signal detection section in the remote control signal generation device shown in FIG. 4. In FIG. 7, the reference numeral 230*a* is newly provided to the primary remote control signal detection section.

When the primary remote control signal is emitted in response to the button operation in the remote controller 100, the primary remote control signal is projected from the light emitting element 120 as, for example, a remote control signal on an infrared beam, and since the primary remote control signal has a form modulated differently in accordance with each of the instructions of the remote operations, the load current by the control circuit 130 becomes to express a different variation (a current waveform) for each projection of such an instruction (signal).

The variation in the load current appears as a variation in the current (i.e., the load current of the converter section of the remote control signal generation device mounted instead of the battery) flowing through the battery in the battery holder 150 as the source thereof. Therefore, the primary remote control signal emitted from the remote controller 100 (the light emitting element 120 thereof) can be distinguished based on the pattern of the load current.

The primary remote control signal detection section shown in FIG. 7 is for detecting the primary remote control signal in accordance with the principle as described above, and configured including a load current detection section 235 for detecting the load current of the converter section 220, and a primary remote control signal distinguishing section 236 for distinguishing the primary remote control signal based on the pattern (the current waveform) of the variation in the current detected by the load current detection section 235.

The output of such a primary remote control signal distinguishing section 236 is supplied to the signal code conversion processing section 240, and then converted by the action of the signal code conversion processing section 240 into the secondary remote control signal different in code system therefrom to be output.

Figure 8:
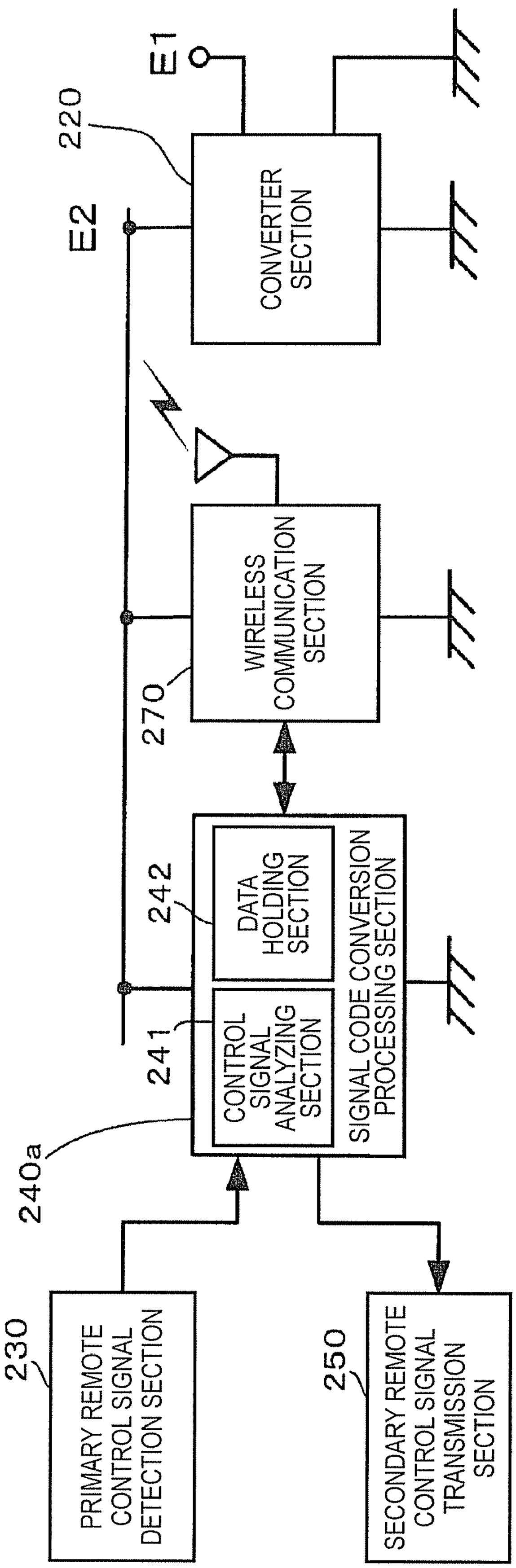
FIG. 8 is a block diagram showing a relationship among elements in another example of the remote control signal generation device shown in FIG. 1C.

FIG. 8 is a block diagram showing a relationship of the elements inside the exterior member 210 of another example of the remote control signal generation device 200 explained with reference to FIGS. 1A, 1B, and 1C, and the elements outside the exterior member 210 connected thereto with the covered wire 201.

In FIG. 8, corresponding sections to the sections shown in FIG. 4 described above are shown denoted with the same reference numerals, and explanations therefor will be omitted.

In the embodiment shown in FIG. 8, a control signal analyzing section 241 for analyzing the instruction content of the signal supplied from the primary remote control signal detection section 230 is provided as the signal code conversion processing section 240*a*, and further, there is also provided a data holding section 242 for holding a data table provided for the analyzing process in the control signal analyzing section 241 and for the conversion process for converting the primary remote control signal compliant to one code system according to the remote controller 100 into the secondary remote control signal compliant to another code system.

Still further, there is provided a wireless communication section 270 for performing short-range high-speed communication compliant to, for example, Bluetooth. According to the communication in the wireless communication section 270, the data table to be held in the data holding section 242 can be obtained from the outside.

Therefore, without preparing the data such as the data table used for converting the primary remote control signal into the secondary remote control signal compliant to another code system from the beginning, the appropriate data table corresponding to needs can prepared via the wireless communication section 270.

Figure 9:
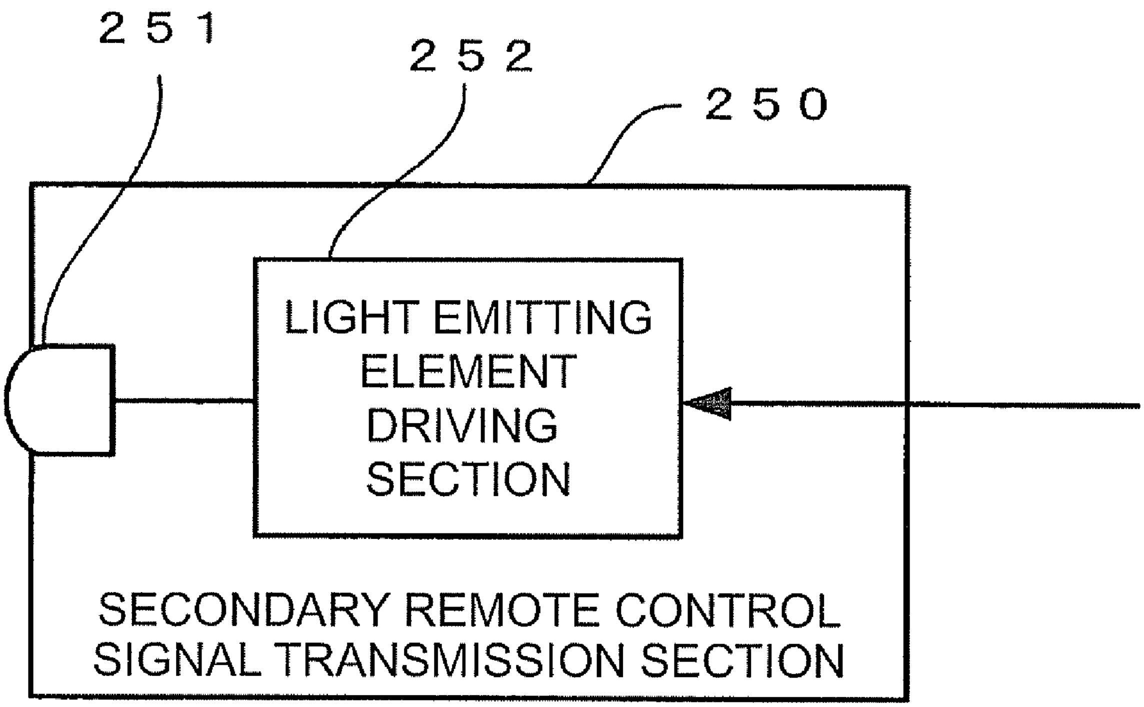
FIG. 9 is a diagram showing a configuration example of a secondary remote control signal transmission section in the remote control signal generation device shown in FIG. 4.

FIG. 9 is a diagram showing a configuration example of the secondary remote control signal transmission section 250 in the remote control signal generation device 200 shown in FIG. 4. The light emitting element 251 for projecting the secondary remote control signal, which is the output of the signal code conversion section 240, as a light signal is driven by the light emitting element driving section 252, which responds to the output of the secondary remote control signal transmission section 250, to emit light, and the secondary remote control signal compliant to the different code system from that of the primary remote control signal of the remote controller 100 is formed as a light signal to be transmitted to the target apparatus to be the control target.

As described schematically with reference to FIGS. 1A through 1C, the light receiving element 231 and the light emitting element 251 described above are integrally combined with each other with an appropriate fixing member to form the reception/transmission unit 260, and the reception/transmission unit 260 is adhered at a front end region of the remote controller 100 where the light receiving element 231 positions adjacently to the light emitting element 120 of the remote controller 100 using, for example, a member such as a double-sided adhesive tape.

Figure 10:
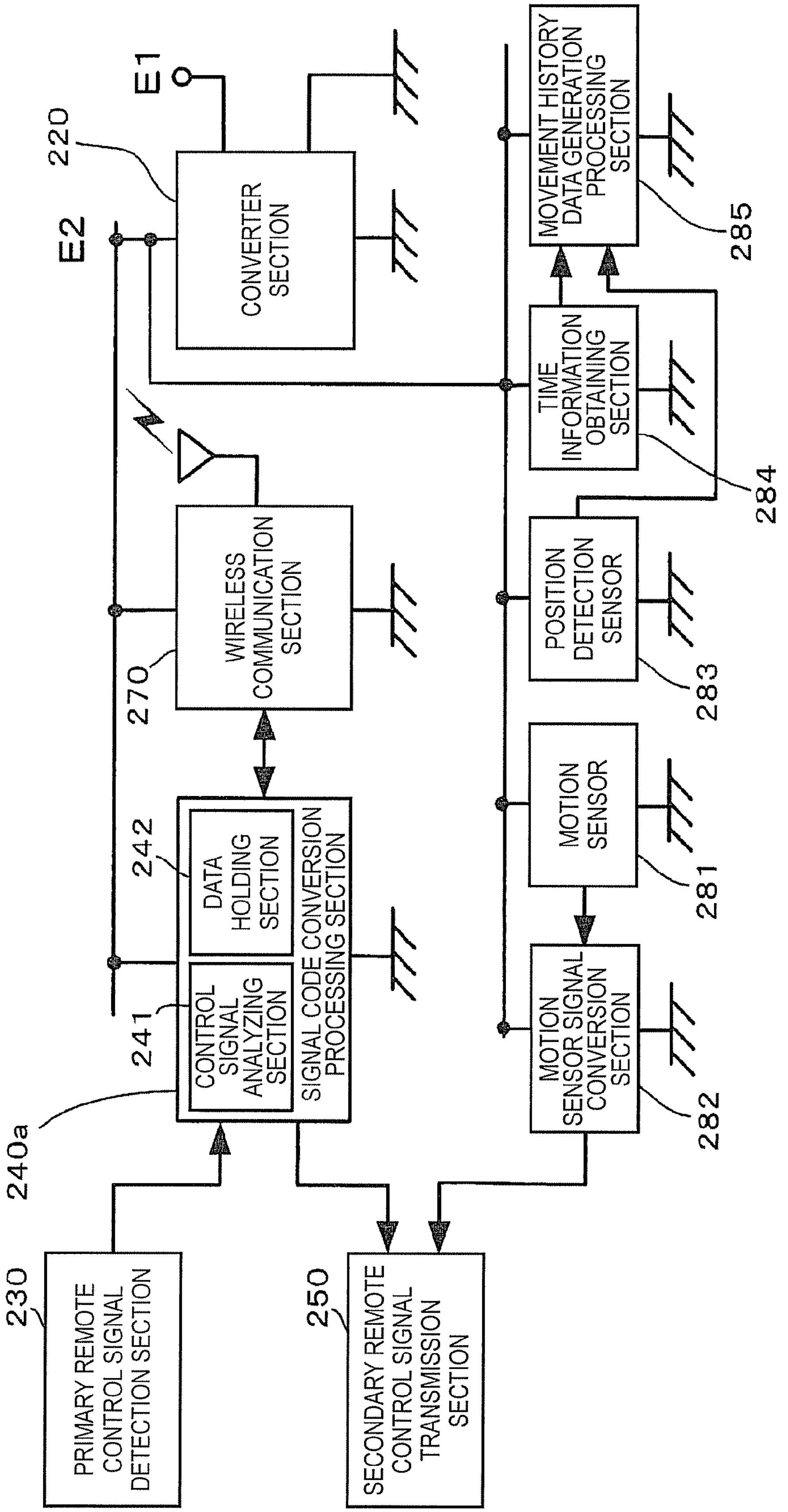
FIG. 10 is a block diagram showing a relationship among elements in still another example of the remote control signal generation device shown in FIG. 1C.

FIG. 10 is a block diagram showing a relationship among elements in still another example of the remote control signal generation device shown in FIG. 1C.

In FIG. 10, corresponding sections to the sections shown in FIG. 8 described above are shown denoted with the same reference numerals, and explanations therefor will be omitted.

The embodiment shown in FIG. 10 is different from the embodiment described above in that there is also provided a function of generating the remote control signal by another operation method independently of the line of generating the remote control signal to be output from the secondary remote control signal transmission section 250 as the output of the signal code conversion section 240*a*.

In other words, there are provided a motion sensor 281 disposed integrally with the main body of the remote control signal generation device 200 or at least in the relationship with the remote controller 100 in which the relative position is fixed, and a motion sensor signal conversion section 282 for performing a signal conversion process for transmitting the remote control signal from the secondary remote control signal transmission section 250 in accordance with a pattern of the detection value based on the output of the motion sensor 281.

In response to a motion of the user picking up the remote controller 100, movement thereof in the vertical and horizontal directions corresponding to an operation of a specific button, or a motion of drawing a locus of predetermined movement such as circling movement in a clockwise direction or a counterclockwise direction, the remote control signal for performing the remote control of the target apparatus by a different method from the button operation in the remote controller 100 is generated along a line connecting the motion sensor 281 the motion sensor signal conversion section 282→the secondary remote control signal transmission section 250, and is then transmitted.

Specifically, the motion sensor signal conversion section 282 has a command conversion table used for a conversion process for converting the motion (an operation of the user) of the remote controller 100 detected by the motion sensor 281 into the secondary remote control signal.

When a motion of the user holding the remote controller 100 in his or her hand is detected by the motion sensor 281, the motion sensor signal conversion section 282 looks up the command conversion table to generate the secondary remote control signal corresponding to the motion. The secondary remote control signal thus generated by the motion sensor signal conversion section 282 is transmitted to the target apparatus from the secondary remote control signal transmission section 250.

FIG. 11 is a diagram showing a specific example of the command conversion table used for the conversion process for converting motion of the remote controller 100 detected by the motion sensor 281 into the secondary remote control signal.

In FIG. 11, the command conversion table stores the motions detected by the motion sensor 281 and signal codes of the secondary control signal respectively corresponding to the motions in a condition of one-to-one correspondence.

For example, when the user holds the remote controller 100 in his or her hand and shakes it upward, the motion sensor 281 detects the upward movement of the remote controller 100. Then, the motion sensor signal conversion section 281 detects the motion pattern "shaking upward" in the command conversion table, and generates the secondary remote control signal corresponding thereto.

It should be noted that the various kinds of motions (e.g., "shaking upward," "drawing a circle clockwise," and "drawing a line from left to right") in the remote controller 100 are made correspond respectively to the operations (e.g., "powering on," "increasing sound volume," and "incrementing channel number") to the target apparatus.

In this case, the command conversion table used for converting the motion in the remote controller 100 into the secondary remote control signal can be customized to the content corresponding to the target apparatus thus installed in accordance with the selection input of the user.

Specifically, the target to be controlled by the secondary remote controlled signal can be set to two or more sources (e.g., analog broadcasting, digital broadcasting, charged contents, and free contents).

Further, the data table can be configured so as to be changed in accordance with a location (i.e., difference in controlled apparatus thus installed) and time.

It should be noted that the secondary remote control signal transmitted from the secondary remote control signal transmission section 250 to the controlled apparatus in the present embodiment of the invention can be transmitted on an infrared beam or as a wireless signal of, for example, short-range wireless communication, and various kinds of communication media can be adopted thereto providing they can control the controlled apparatus.

Further, in the embodiment shown in FIG. 10, there are further provided a position detection sensor 283 using a gyroscope or GPS, and a time information obtaining section 284 such as a wave clock, and it is configured so that the history of movement regarding the remote control signal generation device 200 (i.e., the remote controller 100 applying the remote control signal generation device 200) according to the present embodiment of the invention can be obtained in a movement history data generation processing section 285 based on the positional information of the position detection sensor 283 and the time information of the time information obtaining section 284.

In, for example, the case in which such a remote controller is used for a digital broadcasting receiver as the target apparatus, there can be provided a way to make the remote controller intelligent such that it can identify two or more users by, for example, learning the movement history data from the movement history data generation processing section 285 to perform a tuning operation suitable for the identified user by priority in accordance with the circumstance.

Figure 12:
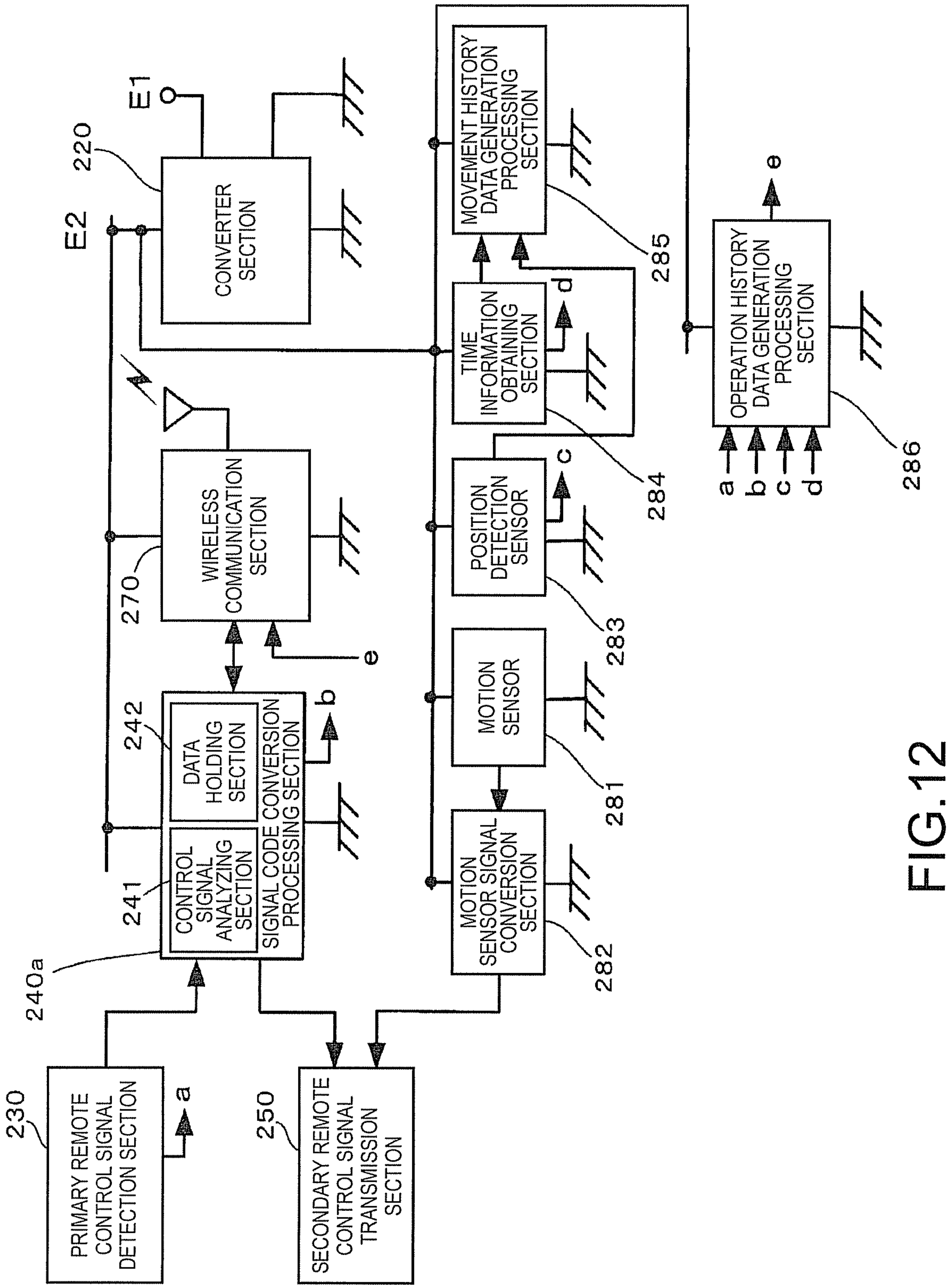
FIG. 12 is a block diagram showing a relationship among elements in still another example of the remote control signal generation device shown in FIG. 1C.

FIG. 12 is a block diagram showing a relationship among elements in still another example of the remote control signal generation device shown in FIG. 1C.

In FIG. 12, corresponding sections to the sections shown in FIG. 10 described above are shown denoted with the same reference numerals, and explanations therefor will be omitted.

In the embodiment shown in FIG. 12, there is further provided an operation history data generation processing section 286 for generating operation history data based on the operation condition of at least one of the primary remote control signal detection section 230 and the signal code conversion processing section 240*a* and an output of at least one of the position detection sensor 283 and the time information obtaining section 284.

The operation history data generation processing section 286 according to the present embodiment receives data a regarding the operation condition (i.e., detected condition regarding what control command was included in the remote control signal issued by the remote controller 100) of the primary remote control signal detection section 230, data b regarding the operation condition (i.e., the conversion condition regarding what primary remote control signal of the remote controller 100 was converted into the secondary remote control signal) of the signal code conversion processing section 240*a*, data c regarding the detection condition of the position from the position detection sensor 283, and the time data d from the time information obtaining section 284 to generate the operation history data regarding the remote controller 100 applying the remote control signal generation device 200 based selectively thereon as described above.

Further, the operation history data generation processing section 285 is capable of transmitting the operation history data e thus generated via a wireless communication section 270.

Therefore, there is provided a way to provide the user of the remote controller with further convenience such that it can find out a tendency of the remote control by, for example, learning the operation history data to perform specific control by priority in accordance with the condition.

Further, since the operation history data is transmitted to the outside via the wireless communication section 270 (connectable to a wireless LAN), it can serve an application usage such that the safety of the user is estimated from the use condition regarding the remote controller, thereby watching the user from a relatively distant place.

Figure 13:
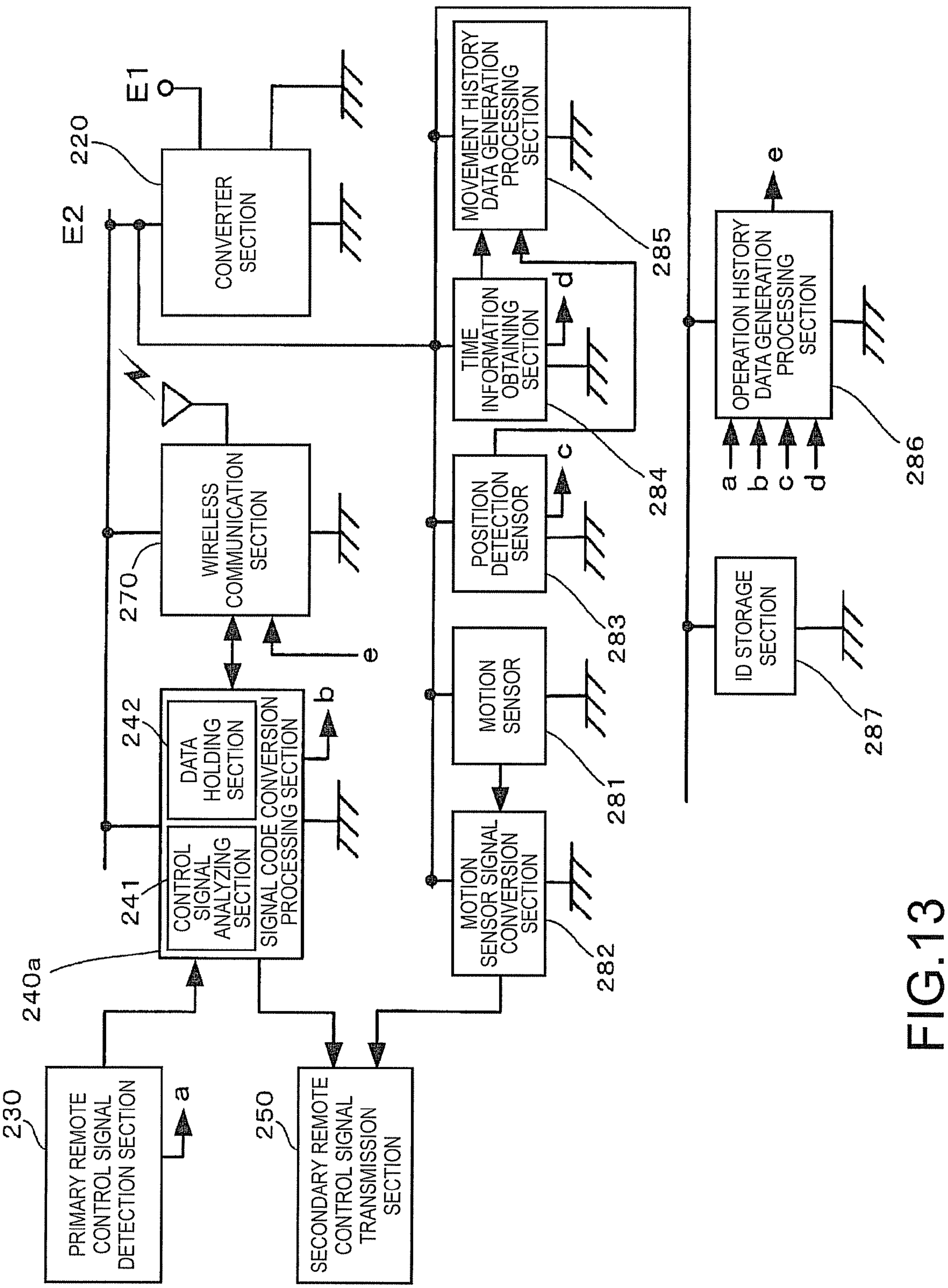
FIG. 13 is a block diagram showing a relationship among elements in still another example of the remote control signal generation device shown in FIG. 1C.

FIG. 13 is a block diagram showing a relationship among elements in still another example of the remote control signal generation device shown in FIG. 1C.

In FIG. 13, corresponding sections to the sections shown in FIG. 12 described above are shown denoted with the same reference numerals, and explanations therefor will be omitted.

In the embodiment shown in FIG. 13, the remote control signal generation device 200 is provided with an ID storage section 287 for storing the ID, thus various kinds of history of the remote controller 100 such as the movement history or the operation history are stored in conjunction with the ID.

The ID storage section 287 is provided with a storage medium (e.g., a memory card) detachably attached to the remote control signal generation device 200, and a reading device (e.g., a memory card reader) for retrieving the information stored in the storage medium, the storage medium storing a unique identification number (ID).

The storage medium storing the ID of the ID storage section 287 is allowed to be held by each of two or more users using the remote controller 100 as the information for identifying each of the users.

Further, by storing the movement history or the operation history of the remote controller 100 in conjunction with the ID stored in the ID storage section 287 in the movement history data generation processing section 285 or the operation history data generation processing section 286, the movement history or the operation history can be understood while being discriminated for every user.

By adopting such an embodiment, a unique control for every user can be performed, thus the functions of the remote controller 100 can further be improved.

Assuming that the remote controller 100 is, for example, a remote controller of an air conditioner as the target apparatus, setting of the room temperature can automatically be performed in accordance with the user. Specifically, it becomes possible that when the room temperature is 23° C., the past operation content at the room temperature of 23° C. is judged with reference to the operation history and the ID, and the control for slightly raising the room temperature is performed for the user A or the control for slightly lowering the room temperature is performed for the user B.

It should be noted that although the operation history is assumed to be stored in the present embodiment, it is also possible to store the content selected by the operation as the history such that the actually viewed program is specified based on the operation history and the program timetable.

In this case, even if the location where the target apparatus is installed is changed to incur the condition in which the relationship between the cannel number and the broadcasting station is changed, the content the user has viewed in the past can accurately be understood.

Further, the following embodiment can be realized using the remote controller 100 according to the present embodiment.

Figure 14:
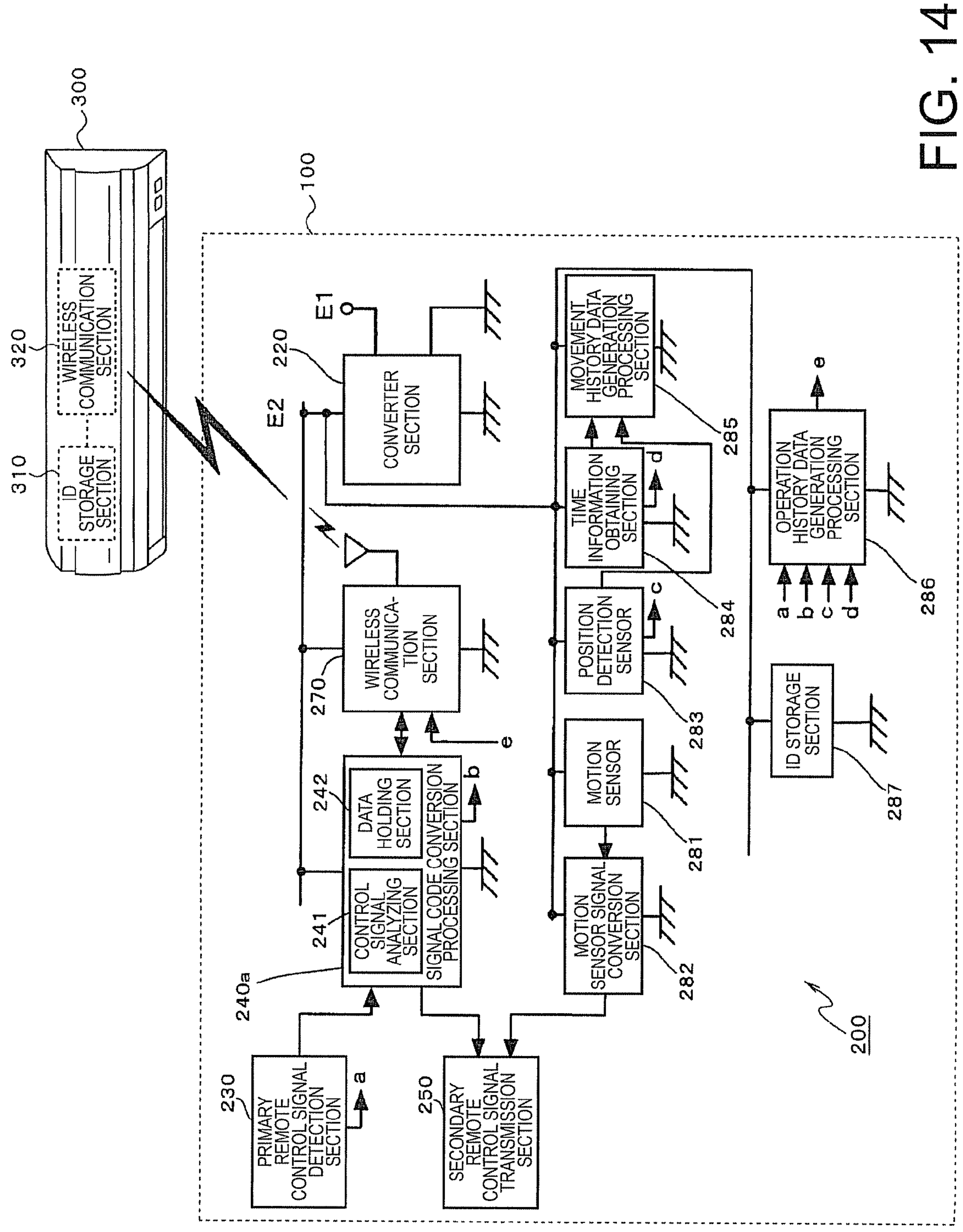
FIG. 14 is a diagram showing a configuration of a remote control system including a target apparatus operating in cooperation with a remote control signal generation device 200 shown in FIG. 13.

FIG. 14 is a diagram showing a configuration of a remote control system including a target apparatus operating in cooperation with the remote control signal generation device 200 shown in FIG. 13.

In FIG. 14, corresponding sections to the sections shown in FIG. 13 described above are shown denoted with the same reference numerals, and explanations therefor will be omitted.

In the embodiment shown in FIG. 14, the function of storing the ID is provided not only to the remote control signal generation device 200 but also to an air conditioner 300 as the target apparatus.

In other words, in FIG. 14, an ID storage section 310 of the air conditioner 300 as the target apparatus stores the identification number (ID) provided uniquely to the target apparatus. Further, a wireless communication section 320 of the air conditioner 300 is capable of communicating the ID with the wireless communication section 270 of the remote control signal generation device 200 by performing, for example, short-range high-speed communication compliant to Bluetooth.

Under such a configuration, in the present embodiment, the air conditioner 300 as the target apparatus and the remote controller 100 perform communication of the operation signal (the secondary remote control signal) while notifying each other of the ID.

By adopting such a configuration, functional reinforcement with the target apparatus and the remote controller 100 can be achieved, and the user is allowed to control various kinds of target apparatuses with the remote controller 100, which is an accustomed apparatus with a favorite exterior.

When, for example, the same user operates different apparatuses with the unique remote controller 100, the secondary remote control signal (i.e., the data table in the signal code conversion section 240*a*) can automatically be switched based on the ID of the target apparatus.

Further, it becomes also possible that when the same user operates different target apparatuses of the same model, different control corresponding to each of the apparatuses according to the operation history of each of the target apparatuses is performed based on the ID of each of the target apparatuses. In, for example, the case in which air conditioners of the same model are respectively installed in a bedroom and a living room, it becomes possible to automatically reproduce daily setting the user makes in each of the rooms referring with discrimination to the operation history in the living room and the operation history in the bedroom based on the ID transmitted from each of the air conditioners.

It should be noted that in the present embodiment by providing a similar function (the operation history data storing function) to the function of the operation history data generation processing section 285 in the remote control signal generation device 200 also to the target apparatus and configuring the remote control system in which the target apparatus operates in cooperation with the remote controller 100 applying the remote control signal generation device 200 described above, the operation history can be managed in the target apparatus side in conjunction with the ID of the remote controller 100. In this case, the operation such that the ID is transmitted from the remote controller 100 to the target apparatus when powered on, and the target apparatus automatically perform the optimum setting base on the operation history corresponding to the ID becomes possible.

In sum total of the above, in the embodiments of the invention, the electromotive force (in the case in which two or more real batteries are provided, the electromotive force caused by the batteries connected in series) E1 caused by the real battery mounted in the battery holder 150 together therewith is stepped-up by the converter section 220, and the rated voltage E2 in the condition in which the rated number of real batteries are mounted can be obtained, thus the rated voltage E2 is supplied to each of the relevant sections as the circuit power supply voltage.

Specifically, the circuit power supply voltage E2 described above is supplied to the signal code conversion section 240, 240*a*, the wireless communication section 270, the motion sensor 281, the motion sensor signal conversion section 282, the position detection sensor 283, the time information obtaining section 284, the movement history data generation processing section 285, the operation history data generation processing section 286, and the ID storage section 287, thus each of the sections can exert its original function.

Therefore, by mounting the remote control signal generation device according to the embodiment of the invention in a common remote controller (the battery holder thereof), it becomes possible to convert the primary remote control signal compliant to one code system according to the remote controller into the secondary remote control signal compliant to another code system and to output the secondary remote control signal, thereby remote-controlling the target apparatus compatible to the secondary remote control signal.

In this case, in order for making the remote control signal generation device functions properly, no alteration is required to the remote controller itself.

Therefore, only by mounting the remote control signal generation device according to the embodiment of the invention to the battery holder of a common remote controller at the user's option, it becomes possible to remote-control the target apparatus which cannot be remote-controlled by the remote controller in the normal specification.

It should be noted that in the remote control signal generation device according to the embodiment of the invention described above, the secondary remote control signal can utilize a wireless function such as Bluetooth.

The entire disclosure of Japanese Patent Application No. 2008-044500, filed Feb. 26, 2008 is expressly incorporated by reference herein.

What is claimed is:

1. A remote control signal generation device for converting a primary remote control signal compliant to a first code system used by a predetermined remote controller into a secondary remote control signal compliant to a second code system and outputting the secondary remote control signal, the predetermined remote controller having a battery holder configured to hold a plurality of batteries having a predetermined specification as a power source to obtain a rated electromotive force from the plurality of batteries, the remote control signal generation device comprising:

an exterior member configured to be held in the battery holder, in place of one of the plurality of batteries and electrically coupled to the predetermined remote controller;

a converter section, responsive to the exterior member electrically coupled to the predetermined remote controller, for being supplied with a voltage corresponding to a total value of the electromotive force of the remaining batteries to convert the supplied voltage into an output voltage corresponding to the rated electromotive force;

a primary remote control signal detection section for detecting the primary remote control signal;

a signal code conversion processing section for generating the secondary remote control signal compliant to the second code system corresponding to the primary remote control signal detected by the primary remote control signal detection section; and a secondary remote control signal transmission section for transmitting the secondary remote control signal generated by the signal code conversion processing section, wherein the converter section and the signal code conversion processing section are disposed in the exterior member.

2. The remote control signal generation device according to claim 1, wherein the primary remote control signal detection section includes a light receiving section for receiving an optical signal as the primary remote control signal of the remote controller.

3. The remote control signal generation device according to claim 1, wherein the primary remote control signal detection section includes a load current detection section for detecting a load current corresponding to the primary remote control signal of the remote controller, and a primary remote control signal distinguishing section for distinguishing a content of the primary remote control signal based on a waveform of the load current detected by the load current detection section.

4. The remote control signal generation device according to claim 1, wherein the signal code conversion processing section includes a data holding section holding a data table from which correspondence between the first code system and the second code system is referable.

5. The remote control signal generation device according to claim 4, further comprising a wireless communication section for obtaining the data table to be held in the data holding section.

6. The remote control signal generation device according to claim 1, wherein the signal code conversion processing section includes a control signal analyzing section for analyzing a content of the primary remote control signal detected by the primary remote control signal detection section.

7. The remote control signal generation device according to claim 1, wherein the secondary remote control signal transmission section includes a light emitting element for transmitting the secondary remote control signal generated by the signal code conversion processing section with an optical signal.

8. The remote control signal generation device according to claim 1, further comprising a motion sensor signal conversion section for generating the secondary remote control signal based on a predetermined output of a motion sensor.

9. The remote control signal generation device according to claim 1, further comprising:

a position detection sensor;

a time information obtaining section; and a movement history data generation processing section for generating movement data of the exterior member based on outputs of the position detection sensor and the time information obtaining section.

10. The remote control signal generation device according to claim 9, further comprising an operation history data generation processing section for generating operation history data based on an operation condition of at least one of the primary remote control signal detection section and the signal code conversion section processing section, and based on an output of at least one of the position detection sensor and the time information obtaining section.

11. The remote control signal generation device according to claim 1, further comprising an identification storage section for storing a unique identification number.

12. The remote control signal generation device according to claim 11, wherein the identification storage section includes a storage medium for storing the identification number, and a reading device for retrieving the identification number stored in the storage medium, wherein the storage medium is detachable from the reading device.

13. A remote control system comprising:

a remote control signal generation device for converting a primary remote control signal compliant to a first code system according to a predetermined remote controller into a secondary remote control signal compliant to a second code system, and for outputting the secondary remote control signal, the predetermined remote controller having a battery holder configured to hold a plurality of batteries having a predetermined specification as a power source to obtain a rated electromotive force from the plurality of batteries; and a target apparatus controlled by the remote control signal generation device, wherein the remote control signal generation device includes:

an exterior member having shape and size configured to be held in the battery holder in place of one of the plurality of batteries and electrically coupled to the predetermined remote controller, a converter section, responsive to the exterior member electrically coupled to the predetermined remote controller, for being supplied with a voltage corresponding to a total value of the electromotive force of the remaining batteries to convert the supplied voltage into an output voltage corresponding to the rated electromotive force, a primary remote control signal detection section for detecting the primary remote control signal, a signal code conversion processing section for generating the secondary remote control signal compliant to the second code system corresponding to the primary remote control signal detected by the primary remote control signal detection section, a secondary remote control signal transmission Section for transmitting the secondary remote control signal generated by the signal code conversion processing section, and a first identification storage section for storing a first unique identification number, the converter section and the signal code conversion processing section being disposed inside the exterior member, and the target apparatus includes a second storage section for storing a second unique identification number, the remote control signal generation device and the target apparatus communicating the first and second identification numbers stored therein, respectively.

* * * * *